US012112199B2

(12) United States Patent
Schneider et al.

(10) Patent No.: US 12,112,199 B2
(45) Date of Patent: Oct. 8, 2024

(54) INTERRUPTIBLE LZO DECOMPRESSION

(71) Applicant: Honeywell International Inc., Charlotte, NC (US)

(72) Inventors: Maximilian Waldo Schneider, Mainz (DE); Francois Vincent, Hessen (DE); Ralf Peter Thor, Baden-Wuerttemberg (DE)

(73) Assignee: Honeywell International Inc., Charlotte, NC (US)

( * ) Notice: Subject to any disclaimer, the term of this patent is extended or adjusted under 35 U.S.C. 154(b) by 75 days.

(21) Appl. No.: 17/456,937

(22) Filed: Nov. 30, 2021

(65) Prior Publication Data

US 2023/0168928 A1   Jun. 1, 2023

(51) Int. Cl.
*G06F 16/174* (2019.01)
*G06F 1/30* (2006.01)
*G06F 9/48* (2006.01)
*G06T 9/00* (2006.01)

(52) U.S. Cl.
CPC .............. *G06F 9/4893* (2013.01); *G06F 1/30* (2013.01); *G06T 9/00* (2013.01)

(58) Field of Classification Search
None
See application file for complete search history.

(56) References Cited

U.S. PATENT DOCUMENTS

| | | | |
|---|---|---|---|
| 5,835,740 A | 11/1998 | Wise | |
| 6,081,752 A | 6/2000 | Benson, IV et al. | |
| 6,636,958 B2 | 10/2003 | Abboud et al. | |
| 7,549,042 B2 | 6/2009 | Glaum et al. | |
| 7,747,980 B2* | 6/2010 | Illowsky | G06F 8/24 717/121 |
| 7,805,719 B2 | 9/2010 | O'Neil | |
| 7,886,093 B1 | 2/2011 | Chen | |
| 8,055,096 B2 | 11/2011 | Dahms et al. | |
| 8,135,958 B2 | 5/2012 | Greco et al. | |
| 8,201,054 B2 | 6/2012 | Slyz et al. | |
| 8,341,604 B2* | 12/2012 | Codrescu | G06F 11/3656 717/124 |

(Continued)

FOREIGN PATENT DOCUMENTS

| | | |
|---|---|---|
| EP | 2017726 A2 | 1/2009 |
| EP | 2711858 A1 | 3/2014 |

(Continued)

OTHER PUBLICATIONS

ZGIP(1): General Commands Manual, 1993, Jean-loup Gailly (Year: 1993).*

(Continued)

*Primary Examiner* — Hyun Nam
(74) *Attorney, Agent, or Firm* — John Maldjian, Esq.; Stevens & Lee PC

(57) ABSTRACT

A method includes inputting a compressed image in a computing system. The method also includes a process of decompressing another image over the compressed image by a processor. Power is restored to the process of decompressing the image in response to an interruption to the decompression process. The decompressed image is configured to (Continued)

override the inputted compressed image. The method also includes completing the process of decompressing the image over the inputted compressed image.

18 Claims, 4 Drawing Sheets

(56) References Cited

U.S. PATENT DOCUMENTS

| | | | |
|---|---|---|---|
| 8,522,233 | B2 | 8/2013 | Nakamura et al. |
| 8,943,492 | B2 | 1/2015 | Scian et al. |
| 9,720,616 | B2* | 8/2017 | Yu .................... G06F 3/0604 |
| 10,055,353 | B2 | 8/2018 | Nachimuthu et al. |
| 10,972,741 | B2 | 4/2021 | Simpson |
| 2003/0022665 | A1 | 1/2003 | Rajaram |
| 2005/0114852 | A1 | 5/2005 | Chen et al. |
| 2010/0325523 | A1 | 12/2010 | Slyz et al. |
| 2012/0102477 | A1 | 4/2012 | Kim |
| 2012/0150877 | A1 | 6/2012 | Ramamurthy |
| 2012/0227036 | A1 | 9/2012 | Crk |
| 2013/0024545 | A1 | 1/2013 | Sheppard |
| 2017/0090903 | A1 | 3/2017 | Bainville |
| 2017/0118675 | A1* | 4/2017 | Boch .................... H04L 69/04 |
| 2017/0212750 | A1 | 7/2017 | Stutzenberger |
| 2017/0337204 | A1 | 11/2017 | Szilagyi |
| 2018/0060235 | A1 | 3/2018 | Yap et al. |
| 2018/0095668 | A1 | 4/2018 | Malyugin et al. |
| 2018/0173723 | A1 | 6/2018 | Pfeifle et al. |
| 2019/0265965 | A1 | 8/2019 | Acharya et al. |
| 2019/0324646 | A1 | 10/2019 | Homma |
| 2020/0118516 | A1* | 4/2020 | Kim .................... H04N 19/42 |
| 2020/0241988 | A1 | 7/2020 | Toya |
| 2020/0310782 | A1 | 10/2020 | Ujiie et al. |
| 2023/0168928 | A1* | 6/2023 | Schneider ........... H03M 7/3086 712/220 |
| 2023/0169020 | A1 | 6/2023 | Schneider |
| 2023/0205514 | A1 | 6/2023 | Schneider |

FOREIGN PATENT DOCUMENTS

| | | |
|---|---|---|
| EP | 3680773 A1 | 7/2020 |
| JP | 2003-216465 A | 7/2003 |
| KR | 10-1003888 B1 | 12/2010 |
| KR | 10-1541112 B1 | 1/2015 |
| WO | 2010017326 A1 | 2/2010 |
| WO | 2018091085 A1 | 5/2018 |
| WO | 2019042546 A1 | 3/2019 |
| WO | 2019077607 A1 | 4/2019 |
| WO | 2020088913 A1 | 5/2020 |

OTHER PUBLICATIONS

History of Lossless Data Compression Algorithms, Jan. 2019 (Year: 2019).*
Kumar Amit Mehta, Fail-Proof Over The Air Firmware Upgrade for Embedded Systems, 2016, Tallinn University of Technology (Year: 2016).*
Krishnan et al., 'Secure Intermittent Computing Protocol: Protecting State Across Power Loss', 2019, IEEE Xplore (Year: 2019).*
Moran, Brendan et al. "A Firmware Update Architecture for Internet of Things." Retrieved from: https://tools.ietf.org/id/draft-ietf-suit-architecture-08.html, Retrieved on Jun. 17, 2021 (18 pages total).
Usama M, Zakaria N (2017) Chaos-Based Simultaneous Compression and Encryption for Hadoop. PLoS One 12(1): e0168207. https://doi.org/10.1371/journal.pone.0168207 (18 pages total).
T. Subhamastan Rao et al, / (IJCSIT) International Journal of Computer Science and Information Technologies, vol. 2(5) , 2011, 2369-2374 (6 pages total).
Pillai, Vysakh P., "Secure firmware upgrade for embedded systems" (2017) Retrieved from: https://embeddedinn.xyz/articles/tutorial/Secure-Firmware-upgrade-for-embedded-systems/, Retrieved on: Jul. 7, 2021 (7 pages total).
Reddy, Rakesh, "Upgrading Embedded Design Firmware via USB", Published in Embedded.com (http://www.embedded.com) Jun. 2008 (5 pages total).
Stolikj, M., Cuijpers, P. J. L., & Lukkien, J. J. (2012). Efficient reprogramming of sensor networks using incremental updates and data compression. (Computer science reports; vol. 1210). Eindhoven: Technische Universiteit Eindhoven (14 pages total).
European Search Report mailed May 15, 2023 issued in connection with corresponding EP Application No. 22211904.2 (12 pages total).
European Search Report mailed Apr. 5, 2023 issued in connection with corresponding EP Application No. 22210343.4 (11 pages total).
European Search Report mailed May 23, 2023 issued in connection with corresponding EP Application No. 22210345.9 (8 pages total).
McDonagh, Colin, "Efficient Wireless Incremental Updates to Resource-Constrained Devices", Dissertation submitted to the University of Dublin, Trinity College, May 2018 (66 pages total).
European Search Report mailed Jun. 1, 2023, issued in connection with corresponding EP Application No. 22214493.3 (8 pages total).
Canadian Office Action mailed May 3, 2024; issued in connection with corresponding Canadian Patent Application No. 3,183,509 (5 pages total).
Canadian Office Action mailed May 2, 2024; issued in connection with corresponding Canadian Patent Application No. 3,183,469 (6 pages total).
Canadian Office Action mailed May 15, 2024 issued in connection with corresponding Canadian patent application No. 3,184,605 (4 pages total).

* cited by examiner

200

1. Internal or Exernal memory space. RAM/Flash/EEprom/Etc — 210

2. Compressed file is loaded into the memory space — 220
   | | Compressed file |

Patch application begins. Output is produced as input is consumed
   The process state is tracked by the X, Y variables.

3. X ↓      Y ↓ — 230
   | | Compressed file |

The process is performed in chunks.
   X and Y are updated AFTER a chunk is complete 4. $X_n$ $X_{n+1}$    $Y_n$ $Y_{n+1}$ — 240
   | | | Compressed file |

The Compressed file is overwritten as the output file is produced.

5. X ↓    Y ↓ — 250
   | Partial Output file | Compressed file |

If interrupted the internal state is saved i.e. X and Y.
   When resumed; the internal state is restored and the process continues.

6. X ↓    Y ↓ — 260
   | Partial Output file | Compressed file |

Since X and Y represent the state after the last completed chunk
   The partially processed chunk is repeated and the process continues 7. X ↓    Y ↓ — 270
   | Partial Output file | |

Process completes. Output image is complete.    X Y

8. | Complete Output file | — 280

FIG. 2

INTERRUPTIBLE LZO DECOMPRESSION

TECHNICAL FIELD

The present disclosure generally relates efficiently restarting a decompression process after an interruption of the decompression process occurs.

BACKGROUND

During firmware updates, embedded devices can experience power failure at anytime. Compressed images are used to speed up firmware transfer. In place decompression is used when a compressed image is fully transferred. The inputted compressed image can be overwritten during the in place decompression.

Interruptions occurring during decompression. When the interruptions occur, the output firmware image is incomplete. In addition, the input image is corrupted and has to be retransmitted. Storage size can be increased with additional costs. Another alternative is to forego decompression entirely at the expense of transfer time.

As such, when an interruption occurs there is no way of restarting the decompression process. Either additional storage has to be added, or the decompression process needs to start at the beginning.

A need exists to be able to not require additional storage or have to forego decompression altogether. Moreover, a need exists for the decompression to be able to resume at the same state as before the interruption occurred.

Accordingly, there is a need be able to resume decompression without requiring additional storage and without requiring the decompression process to start over due to an interruption. Moreover, there is a need be able to save each completed state of a decompression process to enable the decompression process to resume at the same state after the interruption.

SUMMARY

The following summary is provided to facilitate an understanding of some of the features of the disclosed embodiments and is not intended to be a full description. A full appreciation of the various aspects of the embodiments disclosed herein can be gained by taking the specification, claims, drawings, and abstract as a whole.

The aforementioned aspects and other objectives can now be achieved as described herein.

In an embodiment, a method includes inputting a compressed image in a computing system. The method also includes beginning a process of decompressing another image over the compressed image by a processor. Power is restored to the process of decompressing the image in response to an interruption to the decompression process. The decompressed image is configured to override the inputted compressed image. The method also includes completing the process of decompressing the image over the inputted compressed image.

The decompressed image overrides the inputted compressed image to complete the decompression process.

The decompression process includes a plurality of states.

The decompression process is split into a plurality of intervals.

In an embodiment, a method includes inputting a compressed image into one or more computational devices. The method also includes beginning an initial step of decompressing an image by at least one processor over at least one flash sector above the compressed image. An internal algorithm state is saved by the processor after the initial step is completed. Restored power is received in response to an interruption to an intermediate step of the decompression process. The method also includes completing a final step of the decompression process of the image by the processor in response to receiving the restored power.

The internal algorithm state is saved when the interruption occurs during the intermediate step.

The method also includes overriding the compressed image to complete the decompression process.

The method also includes saving the internal algorithm state in response to completing the intermediate step of the decompression process.

In an embodiment, a system includes a computing device positioned to receive an inputted compressed image. The system also includes a processor that beings a decompression process by decompressing another image over the inputted compressed image. Power is restored to the process of decompressing the image in response to an interruption to the decompression process. The process of the decompressed image is configured to override the inputted compressed image. The system also includes a memory configured to store the decompressed image over the inputted compressed image.

The processor repeats an initial step and intermediate step of the decompression process in response to a power failure.

The processor repeats each step of the decompression process after receiving the restored power.

The processor saves an internal algorithm state after each step of the decompression process.

BRIEF DESCRIPTION OF THE FIGURES

The accompanying figures, in which like reference numerals refer to identical or functionally similar elements throughout the separate views and which are incorporated inf and form a part of the specification, further illustrate the present invention and, together with the detailed description of the invention, serve to explain the principles of the present invention.

FIG. 2 illustrates schematic process in accordance with the invention;

Figure 1:
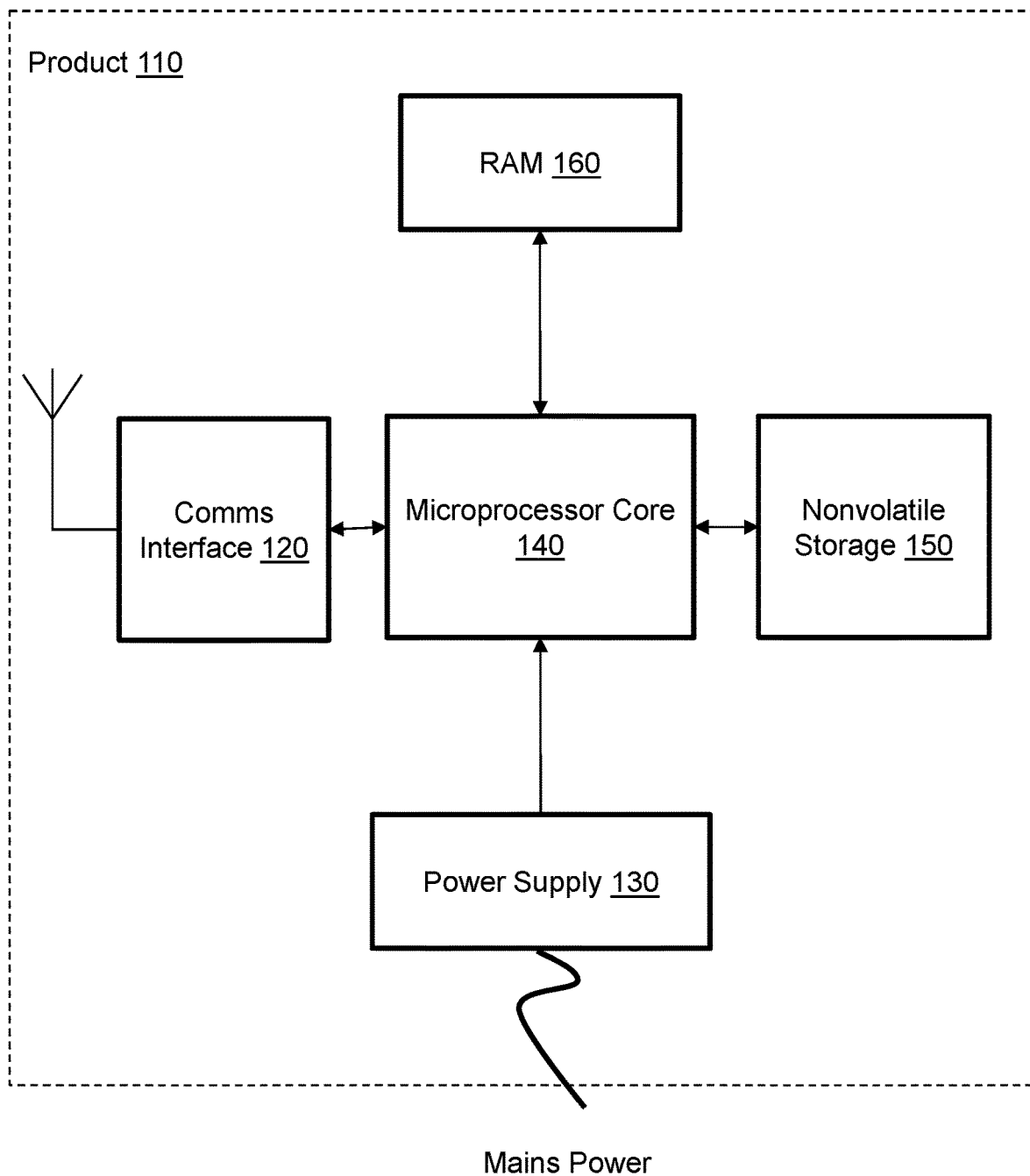
FIG. 1 illustrates a system diagram in accordance with an embodiment of the invention.

Unless otherwise indicated illustrations in the figures are not necessarily drawn to scale.

DETAILED DESCRIPTION OF SOME EMBODIMENTS

Background and Context

The particular values and configurations discussed in these non-limiting examples can be varied and are cited merely to illustrate one or more embodiments and are not intended to limit the scope thereof.

Subject matter will now be described more fully herein after with reference to the accompanying drawings, which form a part hereof, and which show, by way of illustration, specific example embodiments. Subject matter may, however, be embodied in a variety of different form and, therefore, covered or claimed subject matter is intended to be construed as not being limited to any example embodiments set forth herein, example embodiments are provided merely to be illustrative. Likewise, a reasonably broad scope for claimed or covered subject matter is intended. Among other issues, subject matter may be embodied as methods, devices, components, or systems. The followed detailed description is, therefore, not intended to be interpreted in a limiting sense.

Throughout the specification and claims, terms may have nuanced meanings suggested or implied in context beyond an explicitly stated meaning. Likewise, phrases such as "in one embodiment" or "in an example embodiment" and variations thereof as utilized herein may not necessarily refer to the same embodiment and the phrase "in another embodiment" or "in another example embodiment" and variations thereof as utilized herein may or may not necessarily refer to a different embodiment. It is intended, for example, that claimed subject matter include combinations of example embodiments in whole or in part.

In general, terminology may be understood, at least in part, from usage in context. For example, terms such as "and," "or," or "and/or" as used herein may include a variety of meanings that may depend, at least in part, upon the context in which such terms are used. Generally, "or" if used to associate a list, such as A, B, or C, is intended to mean A, B, and C, here used in the inclusive sense, as well as A, B, or C, here used in the exclusive sense. In addition, the term "one or more" as used herein, depending at least in part upon context, may be used to describe any feature, structure, or characteristic in a singular sense or may be used to describe combinations of features, structures, or characteristics in a plural sense. Similarly, terms such as a "a," "an," or "the", again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

One having ordinary skill in the relevant art will readily recognize the subject matter disclosed herein can be practiced without one or more of the specific details or with other methods. In other instances, well-known structures or operations are not shown in detail to avoid obscuring certain aspects. This disclosure is not limited by the illustrated ordering of acts or events, as some acts may occur in different orders and/or concurrently with other acts or events. Furthermore, not all illustrated acts or events are required to implement a methodology in accordance with the embodiments disclosed herein.

Unless defined otherwise, all technical and scientific terms used herein have the same meanings as commonly understood by one of ordinary skill in the art to which the disclosed embodiments belong. Preferred methods, techniques, devices, and materials are described, although any methods, techniques, devices, or materials similar or equivalent to those described herein may be used in the practice or testing of the present invention.

Although claims have been included in this application to specific enumerated combinations of features, it should be understood the scope of the present disclosure also includes any novel feature or any novel combination of features disclosed herein.

References "an embodiment," "example embodiment," "various embodiments," "some embodiments," etc., may indicate that the embodiment(s) so described may include a particular feature, structure, or characteristic, but not every possible embodiment necessarily includes that particular feature, structure, or characteristic.

Headings provided are for convenience and are not to be taken as limiting the present disclosure in any way.

Each term utilized herein is to be given its broadest interpretation given the context in which that term is utilized.

TERMINOLOGY

The following paragraphs provide context for terms found in the present disclosure (including the claims):

The transitional term "comprising", which is synonymous with "including," "containing," or "characterized by," is inclusive or open-ended and does not exclude additional, unrecited elements or method steps. See, e.g., Mars Inc. v. H. J. Heinz Co., 377 F.3d 1369, 1376, 71 USPQ2d 1837, 1843 (Fed. Cir. 2004) ("[L]ike the term 'comprising,' the terms 'containing' and 'mixture' are open-ended."). "Configured to" or "operable for" is used to connote structure by indicating that the mechanisms/units/components include structure that performs the task or tasks during operation. "Configured to" may include adapting a manufacturing process to fabricate components that are adapted to implement or perform one or more tasks.

"Based On." As used herein, this term is used to describe factors that affect a determination without otherwise precluding other or additional factors that may affect that determination. More particularly, such a determination may be solely "based on" those factors or based, at least in part, on those factors.

All terms of example language (e.g., including, without limitation, "such as", "like", "for example", "for instance", "similar to", etc.) are not exclusive of other examples and therefore mean "by way of example, and not limitation . . . ".

A description of an embodiment having components in communication with each other does not infer that all enumerated components are needed.

A commercial implementation in accordance with the scope and spirit of the present disclosure may be configured according to the needs of the particular application, whereby any function of the teachings related to any described embodiment of the present invention may be suitably changed by those skilled in the art.

The flowchart and block diagrams in the figures illustrate the architecture, functionality, and operation of possible implementations of systems and methods according to various embodiments. Functions noted in the block may occur out of the order noted in the figures. For example, two blocks shown in succession may, in fact, be executed substantially concurrently, or the blocks may sometimes be executed in the reverse order, depending upon the functionality involved.

Further, any sequence of steps that may be described does not necessarily indicate a condition that the steps be performed in that order. Some steps may be performed simultaneously.

The functionality and/or the features of a particular component may be alternatively embodied by one or more other devices that are not explicitly described as having such functionality/features. Also, various embodiments of the present invention need not include a device itself.

More specifically, as will be appreciated by one skilled in the art, aspects of the present invention may be embodied as a system and/or method. Furthermore, aspects of the present invention may take the form of a plurality of systems to enable gas meter to perform self-checking to determine its overall functioning without requiring a meter operator.

Introduction

Embodiments of the present invention include a computing system including a microprocessor core that receives an inputted compressed image. At an initial state, an inputted compressed image is received.

At an intermediate state, the decompression process can occur. The microprocessor core within the computing device or system can begin to decompress another image. The decompressing image will be decompressed over at least one flash sector (as indicated by the blank area) and over the inputted compressed image. After a state of the decompression process is completed, the microprocessor core will save the internal algorithm state.

Interruptions can occur at various states or intervals of the decompression process. At either an intermediate state or final state of the decompression process, an interruption can occur. Power failures or other issues with the computing system can cause an interruption to the decompression process. However, the microprocessor core saves the internal algorithm state after each state of the decompression process is completed. As such, when an interruption occurs, each completed state of the decompression process has already been saved. As a result, restored power is received to resume the decompression process. The decompression process can resume at the state in which the interruption occurred instead of having to resume at the beginning of the decompression process.

Although interruptions can occur periodically whether the decompression process at an intermediate or a final state of the decompression state, the internal algorithm state is saved after each completed state. As such, the decompression process will never have to return to initial state to begin the decompression process again.

After each interruption, the decompression process can repeat the state at which the interruption occurred. Any of the completed states have been saved. Therefore, no completed states of the decompression process are lost due to any interruptions.

System Structure

FIG. 1 illustrates a high-level system diagram (system) 100 in an embodiment of the invention. The system 100 can include an output or product 110. In addition, the system 100 can include a communication (comms) interface 120. In addition, a power supply 130 that includes main power can be provided to a microprocessor core 140. A random access memory (RAM) 160 is also connected to the microprocessor core 140. The microprocessor core 140 can perform the key functions for the system 140. The microprocessor core 140 can perform the functions such as saving an internal algorithm state after each state of the decompression process is completed. With the microprocessor core 140 saving the internal algorithm state when the decompression at that state is completed, the decompression can resume at the state at which the interruption occurs after power is restored. The RAM 160 can be used to store various input and output. Further, a nonvolatile storage 150 is connected to the microprocessor core 140. The nonvolatile storage 150 can be used store various input and output as well.

Referring to FIG. 2, a decompression process 200 in an embodiment of the invention is described in more detail. At 210, an internal or external memory space 210 is shown. The internal or external memory can include RAM, Flash, EEPROM. At 220, a compressed input file is loaded into the external or internal memory space. At 230, a patch application begins. Output is produced as input is consumed. A decompression process begins. An image is decompressed over the inputted compressed image. One or more flash sectors are positioned between the inputted compressed image and the decompressing image. At 240, the decompression process is performed in chunks. The variables x and y are updated after a chunk is complete. In other words, an internal algorithm state is updated after each interval or state is completed.

In FIG. 2, at step 250 the decompression process 200 is illustrated wherein the inputted compressed image is overwritten as the output file is produced. The decompressed image will override the inputted compressed image. At 260, an interruption can occur. If an interruption of the decompression process 200 occurs, the internal algorithm state is saved. The point at which the decompression process 200 was interrupted is effectively saved. As such, when the power is restored and the decompression process 200 resumes, the internal algorithm state is restored and the decompression process continues.

Referring to FIG. 2, at 270, as power is restored and the decompression process 200 continues, the variables x and y represent the internal algorithm state after the last completed chunk of the decompression process 200. As such, the partially processed chunk is repeated and the process continues. At 280, the decompression process is completed and the output image is complete. The decompressed output image completely overrides the inputted compressed image.

Figure 3:
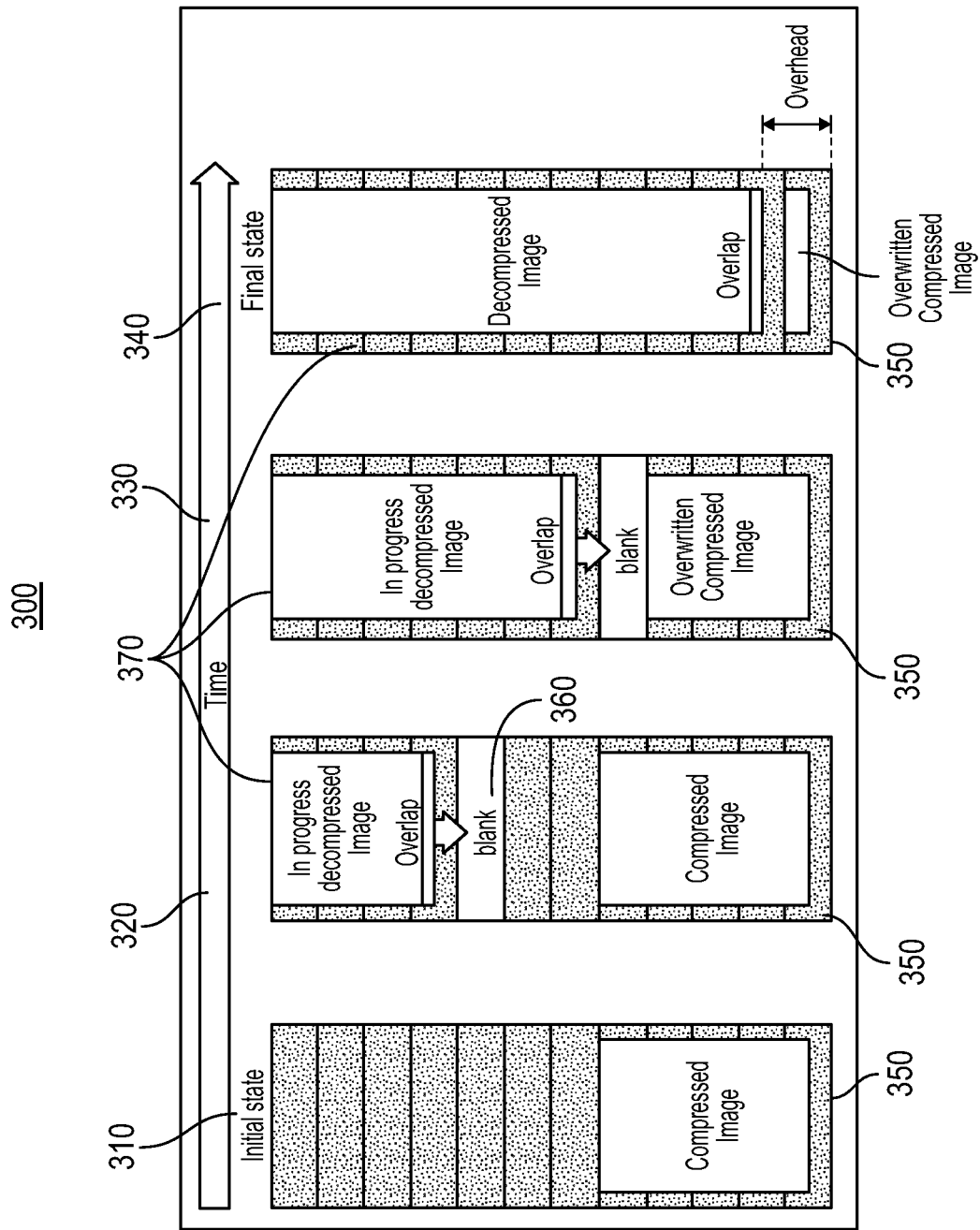
FIG. 3 illustrates a diagrams in accordance with an embodiment of the invention.

With respect to FIG. 3, an embodiment of the decompression process 300 is illustrated in various intervals. At an initial state 310, a compressed image 350 is inputted. At an intermediate state 320, a decompression process 300 begins with an in progress decompressed image 370 being decompressed. The decompressed image 370 is decompressed over at least one flash sector 360, as illustrated by the blank area, and over the inputted compressed image. During the intermediate state 320, the decompression process 300 can be interrupted. An interruption can occur due to a loss of power. An internal algorithm state of the decompression process 300 is saved after each completed state. As such, when the power is restored, the decompression process 300 can resume at the intermediate state 320 to decompress the decompressing image 370. Similarly, another intermediate state 330 is shown. During the additional intermediate state 330, the decompressing mage 370 can begin to override the inputted compressed image 350. The decompression process 300 enables the decompressing image 370 to override the inputted compressed image 350. Further, should an interruption occur at the additional intermediate state 330, the internal algorithm state will be saved when the first intermediate state 320 was completed to enable the decompression process 300 to resume at the additional intermediate state 330 when the power is restored. As such, for the intermediate states 320, 330, an interruption can occur at either intermediate state 320, 330. When the interruption occurs, the internal algorithm state is saved when each intermediate state 320, 330 is completed so that the decompression process 300 can resume at that same state as before the interruption.

In FIG. 3, a final state 340 is shown. At the final state 340, the decompression process 300 can be completed. The decompressing image 370 can completely override the inputted compressed image 350, and become fully decompressed. As with the intermediate states 320, 330 described above, an interruption can occur at the final state 340. The internal algorithm state can be saved after each completed state by the microprocessor core to enable the decompression process 300 to resume at the final state 340 at a later time when the power is restored. Therefore, when the power is restored, the final state 340 can be repeated as necessary to complete the decompression process 300. The decompression image 370 can be fully decompressed and override the inputted compressed image 350. More, when there is an interruption at the intermediate states 320, 330 or the final state 340, the internal algorithm state will be saved after each previously completed state. As a result, when power is restored, the decompression process 300 can begin at the state where the interruption occurred, and repeat that particular state of the decompression process 300.

Figure 4:
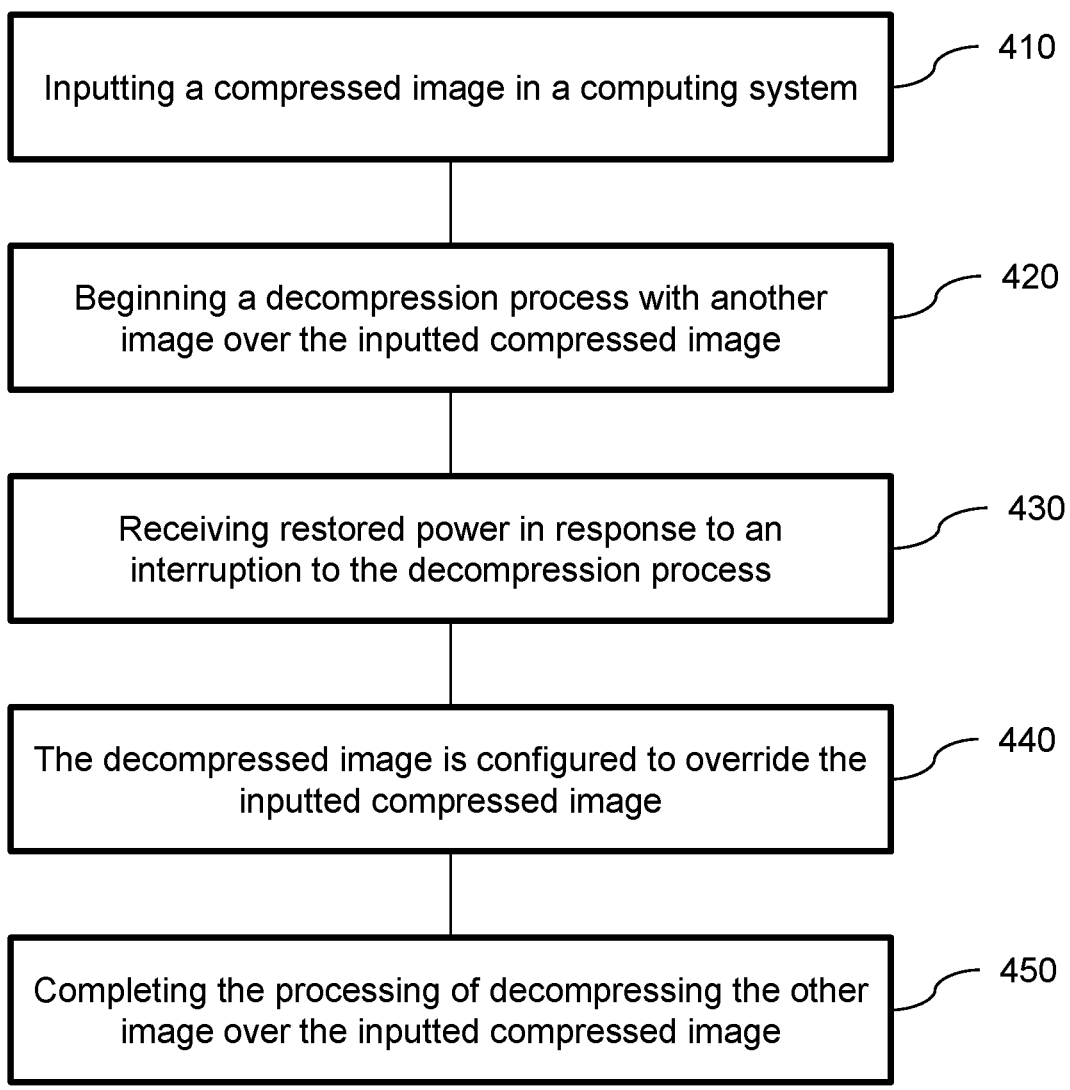
FIG. 4 depicts a flow chart in accordance with an embodiment of the invention.

In FIG. 4, a flowchart illustrating the decompression process 400 of the invention is illustrated. During the decompression process 400, one or more interruptions can occur, such as when power is lost. When there is an interruption, the internal algorithm state is saved after each completed state or interval to enable the decompression process to resume at the state in which the interruption occurred. The microprocessor core can save the internal algorithm state, and when power is restored, the decompression process can resume at the state in which the interruption occurred.

Referring to FIG. 4, at step 410, a compressed image is inputted into a computing system. The computing system can include one or more computational devices. The compressed image can be inputted into the computing system at an initial state.

In FIG. 4, at step 420, an image can being to be decompressed over at least one flash sector and the inputted compressed image. This state can be an intermediate state of the decompression process. During this intermediate state, an interruption can occur due to a loss of power. The microprocessor core will save the internal algorithm state to enable the decompression process 400 to resume at the intermediate state when the power is restored. Accordingly, when the power is restored, the decompression process will resume at the intermediate date, and the decompressing image will continue to be decompressed over the at least one flash section and inputted compressed image.

In FIG. 4, at step 430, after an interruption, restored power can be received. The computing system can receive the restored power. When the restored power is received, the decompression process can resume at the state in which the interruption occurred. The decompression process 400 can repeat the state at which the interruption occurred.

In FIG. 4, at step 440, the decompressing image is configured to override the inputted image. The decompressing image is decompressed over at least one flash sector over the inputted compressed image. As the decompressing process 400 progresses, the decompressing image will override the inputted compressed image.

Referring to FIG. 4, at step 450, the decompression process 400 is completed. The decompressing image is fully decompressed. The fully decompress image completely overrides the inputted compressed image.

Those skilled in the art will appreciate that the example embodiments are non-exhaustive and that embodiments other than that described here may be included without departing from the scope and spirit of the presently disclosed embodiments.

Advantages

Overall, a decompression process of an image over an inputted compressed image can occur inspite of numerous interruptions that occur during the decompression process. During intermediate states, or a final state, the decompression process can be interrupted due a loss of power or other faults of the computing system. As such, inspite of any interruptions that occur, the decompression process can resume successfully when power is restored. The microprocessor core will save the internal algorithm state after each state of the decompression process is completed.

When an interruption occurs at one or more of the intermediate states, an internal algorithm state of the decompression process has been saved. The internal algorithm for each completed state has been saved. The microprocessor core will save the internal algorithm state after each state is completed. When power is restored in response to the interruption, the decompression process will resume at the state in which the interruption occurred. The decompression process need not start at the initial state. The microprocessor core saving the internal algorithm state will enable the decompression process to resume at the same state in which the interruption occurred. The state can be repeated when the power is restored and the decompression process resumes.

The interruptions can occur during any state of the decompression process. As such, during the decompression process, the decompressing image will continue to override the inputted compressed image that is received in the initial state. At the final state when the decompression process is about to conclude, a second or multiple interruptions can occur. Moreover, the microprocessor core will save the internal algorithm state after each state (initial, intermediate, final) is completed. When an interruption occurs at the final state, the decompression process does not need to be repeated from the beginning. When the power is restored, or when the restored power is received, the decompression process can resume at the final state, and the decompression process can be completed in which the decompressed image will fully override the inputted compressed image.

In summary, the decompression process can decompress an image successfully over a flash sector and inputted compressed image inspite of one or more interruptions that may occur. The microprocessor core saving the internal algorithm state after each state of the decompression process is completed enables the decompression process to resume at the state in which the interruption occurs instead of having to repeat the decompression process from the beginning.

CONCLUSION

All references, including granted patents and patent application publications, referred herein are incorporated herein by reference in their entirety.

All the features disclosed in this specification, including any accompanying abstract and drawings, may be replaced by alternative features serving the same, equivalent or similar purpose, unless expressly stated otherwise. Thus, unless expressly stated otherwise, each feature disclosed is one example only of a generic series of equivalent or similar features.

Various aspects of the invention have been described above by way of illustration, and the specific embodiments disclosed are not intended to limit the invention to the particular forms disclosed. The particular implementation of the system provided thereof may vary depending upon the particular context or application. The invention is thus to cover all modifications, equivalents, and alternatives falling within the spirit and scope of the following claims. It is to be further understood that not all of the disclosed embodiments in the foregoing specification will necessarily satisfy or achieve each of the objects, advantages, or improvements described in the foregoing specification.

The corresponding structures, materials, acts, and equivalents of all means or step plus function elements in the claims below are intended to include any structure, material, or act for performing the function in combination with other claimed elements as specifically claimed.

What is claimed is:

1. A method for decompression during firmware updates, comprising:
    inputting a compressed image in a computing system;
    beginning a decompression process of decompressing another image over the compressed image by a processor, based on a plurality of states of the decompression process, wherein, as the decompression progresses, the decompressed image overrides the inputted compressed image;
    saving a state of the plurality of states at which an interruption to the decompression process occurs due to loss of power, wherein the state of the decompression process is saved after each completed state;
    resuming the decompression process at the saved state when the power is restored; and
    completing the decompression process of decompressing another image over the inputted compressed image.

2. The method of claim 1, wherein the decompressed image overrides the inputted compressed image to complete the decompression process.

3. The method of claim 1, wherein the plurality of states includes at least one intermediate state and a final state of the decompression process.

4. The method of claim 1, wherein the decompression process is split into the plurality of states.

5. The method of claim 1, further comprising:
    repeating, when the power is restored, the state at which the interruption occurred.

6. The method of claim 1, wherein the decompression process begins with a gap of at least one flash sector above the inputted compressed image, and wherein the at least one flash sector is positioned between the decompressed image and the inputted compressed image.

7. A method for decompression during firmware updates, comprising:
    inputting a compressed image into one or more computational devices;
    beginning an initial step of a decompression process of decompressing an image by at least one processor over an open area above the compressed image, wherein an internal algorithm state is saved by the processor after the initial step is completed, and wherein restored power is received in response to an interruption to an intermediate step of the decompression process, wherein the state of the decompression process is saved after each completed state;
    resuming the decompression process at the saved state when the power is restored; and
    completing a final step of the decompression process of the image by the processor over the inputted compressed image.

8. The method of claim 7, wherein the internal algorithm state is saved when the interruption occurs during the intermediate step.

9. The method of claim 7, further comprising:
    overriding the compressed image to complete the decompression process.

10. The method of claim 7, further comprising:
    saving the internal algorithm state in response to completing the intermediate step of the decompression process.

11. The method of claim 7, further comprising:
    completing an additional intermediate step of the decompression process.

12. The method of claim 7, further comprising:
    repeating at least one intermediate step of decompressing the image in response to a power failure after the restored power is received.

13. The method of claim 7, further comprising:
    restoring the internal algorithm state after the restored power is received.

14. A system for decompression during firmware updates, comprising:
    a computing device configured to receive an inputted compressed image;
    a processor (140) configured to:
    begin a decompression process by decompressing another image over the inputted compressed image, based on a plurality of states of the decompression process, wherein, as the decompression progresses, overrides the inputted compressed image; and
    save a state of the plurality of states at which an interruption to the decompression process occurs due to loss of power, wherein the state of the decompression process is saved after each completed state;
    resume the decompression process at the saved state when the power is restored; and
    complete the decompression process of decompressing another image over the inputted compressed image.

15. The system of claim 14, wherein the processor repeats at least one intermediate step of the decompression process in response to a power failure.

16. The system of claim 14, wherein the processor repeats each step of the decompression process after receiving the restored power.

17. The system of claim 14, wherein the processor saves an internal algorithm state after each step of the decompression process.

18. The system of claim 14, wherein decompressed image overrides the inputted compressed image to complete the decompression process.

* * * * *